(12) United States Patent
Chiba et al.

(10) Patent No.: US 8,631,701 B2
(45) Date of Patent: Jan. 21, 2014

(54) SENSOR DEVICE, MOTION SENSOR, AND ELECTRONIC DEVICE

(75) Inventors: Seiichi Chiba, Minowa (JP); Shuji Kojima, Minamiminowa (JP); Toshiyuki Enta, Yuza (JP); Akinori Shindo, Hokuto (JP); Terunao Hanaoka, Suwa (JP); Yasuo Yamasaki, Shiojiri (JP)

(73) Assignee: Seiko Epson Corporation (JP)

( * ) Notice: Subject to any disclaimer, the term of this patent is extended or adjusted under 35 U.S.C. 154(b) by 231 days.

(21) Appl. No.: 13/225,869

(22) Filed: Sep. 6, 2011

(65) Prior Publication Data

US 2012/0079882 A1 Apr. 5, 2012

(30) Foreign Application Priority Data

Sep. 30, 2010 (JP) ................................. 2010-220798

(51) Int. Cl.
*G01C 19/56* (2012.01)
(52) U.S. Cl.
USPC ..................................... 73/504.12; 73/504.16
(58) Field of Classification Search
USPC ............ 73/504.12, 504.16, 514.29, 493, 431, 73/504.04
See application file for complete search history.

(56) References Cited

U.S. PATENT DOCUMENTS

| 6,698,292 | B2* | 3/2004 | Kikuchi | 73/662 |
| 7,762,134 | B2* | 7/2010 | Katsumata | 73/504.12 |
| 7,849,741 | B2* | 12/2010 | Tateyama et al. | 73/504.12 |
| 8,225,660 | B2* | 7/2012 | Sakai et al. | 73/504.12 |
| 8,250,917 | B2* | 8/2012 | Naruse et al. | 73/504.12 |
| 2005/0257615 | A1* | 11/2005 | Ohta | 73/504.12 |
| 2005/0284223 | A1* | 12/2005 | Karaki et al. | 73/504.12 |
| 2007/0017288 | A1* | 1/2007 | Sato | 73/504.12 |
| 2007/0272015 | A1* | 11/2007 | Kazama et al. | 73/504.08 |

FOREIGN PATENT DOCUMENTS

| JP | 07-306047 | 11/1995 |
| JP | 11-211481 | 8/1999 |
| JP | 2000-121369 | 4/2000 |
| JP | 2005-292079 | 10/2005 |
| JP | 2006-284336 | 10/2006 |
| JP | 2007-173668 | 7/2007 |
| JP | 2007-281341 | 10/2007 |
| JP | 2008-151633 | 7/2008 |

* cited by examiner

*Primary Examiner* — Helen Kwok
(74) *Attorney, Agent, or Firm* — Harness, Dickey & Pierce, P.L.C.

(57) ABSTRACT

A sensor device includes a first electrode disposed on active surface side of a silicon substrate, an external connecting terminal electrically connected to the first electrode, at least one stress relaxation layer disposed between the silicon substrate and the external connecting terminal, a connecting terminal disposed on the active surface side of the silicon substrate, and a vibration gyro element having weight sections as mass adjustment sections, the vibration gyro element is held by the silicon substrate due to connection between the connection electrode and the external connecting terminal, and a meltage protection layer formed in an area where the stress relaxation layer and the mass adjustment section overlap each other in a plan view is provided.

19 Claims, 12 Drawing Sheets

SENSOR DEVICE, MOTION SENSOR, AND ELECTRONIC DEVICE

BACKGROUND

1. Technical Field

The present invention relates to a sensor device, a motion sensor using the sensor device, and an electronic device using the sensor device or the motion sensor.

2. Related Art

In the past, in the field of the sensor device for sensing acceleration, angular velocity, and so on, there has been known a sensor device provided with a sensor element and a circuit element having the function of driving the sensor element.

As such a sensor device, there has been disclosed an angular velocity sensor (a gyro sensor) having a sensor device, which is provided with a gyro vibrator element as a sensor element and a semiconductor device as a circuit element (hereinafter referred to as a semiconductor substrate), housed in a package (see, e.g., JP-A-2007-281341, FIG. 1 (Document 1)).

According to this configuration, the semiconductor substrate is fixed to a support substrate, and is electrically connected to a lead wire section provided to the support substrate. Further, the sensor element (the gyro sensor element) is connected to an inner lead section fixed to a polyimide film disposed between the sensor element and the semiconductor substrate to thereby be disposed so as to keep a gap with the semiconductor substrate and overlap the semiconductor substrate in a plan view. It should be noted that the inner lead section is fixed to the polyimide film, and at the same time, fixed to the support substrate.

Subsequently, the tuning (frequency adjustment, also referred to as F-adjustment) for partially removing a weight layer formed on the principal surfaces (obverse/reverse surfaces) of the sensor element using a laser beam is performed on the sensor element, thus it results that the sensor element has a function with high accuracy (see, e.g., Document 1 and JP-A-2008-151633, FIG. 10).

However, according to the configuration of the sensor device described above, the laser beam used in tuning the sensor element might be transmitted through the sensor element while removing the weight layer, and reach the polyimide film opposed to the sensor element. There is a problem that if the laser beam reaches the polyimide film, a part of the polyimide film irradiated with the laser beam is melted, and bumping of a part of the molten polyimide film causes the part of the molten polyimide film to adhere to the principal surface of the sensor element. It should be noted that the molten particles of the polyimide film thus attached have possibilities of deteriorating the electrical characteristics of the sensor element such as a variation in tuning.

SUMMARY

An advantage of some aspects of the invention is to solve at least a part of the problem described above, and the invention can be implemented as the following forms or application examples.

APPLICATION EXAMPLE 1

This application example of the invention is directed to a sensor device including a semiconductor substrate, a first electrode disposed on an active surface side of the semiconductor substrate, an external connecting terminal disposed on the active surface side and electrically connected to the first electrode, at least one stress relaxation layer disposed between the semiconductor substrate and the external connecting terminal, a connecting terminal disposed on the active surface side of the semiconductor substrate, and a sensor element including a base section, a vibrating section and a connection section extending from the base section, and a mass adjustment section provided to the vibrating section, wherein the sensor element is held by the semiconductor substrate due to connection between the connection section and the external connecting terminal, and a meltage protection layer formed in an area where the stress relaxation layer and the mass adjustment section overlap each other in a plan view is provided.

According to this application example of the invention, since the meltage protection layer is formed in the area where the stress relaxation layer and the mass adjustment section overlap each other in a plan view, the laser beam transmitted through the sensor element is blocked by the meltage protection layer and fails to reach the stress relaxation layer when adjusting the mass adjustment section of the sensor element. Therefore, the meltage of the stress relaxation layer does not occur, and it can be prevented that the meltage of the stress relaxation layer is attached to the principal surface of the sensor element. Thus, it becomes possible to prevent the deterioration of the electrical characteristics of the sensor element such as a variation in tuning due to the molten particles of the polyimide film attached thereto, and the sensor device with stable electrical characteristics can be provided.

Further, it becomes possible to reduce the distance between the sensor element and the stress relaxation layer by providing the meltage protection layer, and it becomes possible to provide a low-profile sensor device.

APPLICATION EXAMPLE 2

This application example of the invention is directed to the sensor device of the above application example of the invention, wherein electrical connection between the first electrode and the external connecting terminal is achieved by at least one relocation wiring disposed on the active surface side.

According to this application example of the invention, the positions and the arrangement of the external connecting terminals of the sensor device can freely (arbitrarily) be designed due to the relocation wiring.

APPLICATION EXAMPLE 3

This application example of the invention is directed to the sensor device of the above application example of the invention, wherein the external connecting terminal is a projection electrode.

According to this application example of the invention, in the sensor device, since the external connecting terminal is a projection electrode, it becomes possible to provide a gap between the sensor element and the semiconductor substrate, and thus, it becomes possible to avoid the contact between the sensor element and the semiconductor substrate. Thus, it becomes possible for the sensor device to perform stable drive of the sensor element.

APPLICATION EXAMPLE 4

This application example of the invention is directed to the sensor device of the above application example of the invention, wherein the meltage protection layer is formed on an external surface on the sensor element side of the stress relaxation layer.

According to this application example of the invention, the formation of the meltage protection layer can be performed simultaneously with the formation of the relocation wiring, and therefore, it becomes possible to easily form the meltage protection layer without increasing the formation process.

APPLICATION EXAMPLE 5

This application example of the invention is directed to the sensor device of the above application example of the invention, wherein the meltage protection layer is a metal layer connected to a ground (GND) potential.

According to this application example of the invention, since the noise propagating to the power supply can be blocked by the meltage protection layer connected to the ground (GND) potential, it becomes possible to perform the power supply with a stable potential.

APPLICATION EXAMPLE 6

This application example of the invention is directed to the sensor device of the above application example of the invention, wherein the active surface of the semiconductor substrate is covered by the meltage protection layer.

According to this application example of the invention, since the noise propagating to the wiring or the like provided to the active area of the semiconductor substrate can be blocked by the meltage protection layer connected to the ground (GND) potential, it becomes possible to prevent the influence of the noise on the electrical characteristics of the semiconductor substrate. Further, since the laser beam transmitted through the sensor element is blocked by the meltage protection layer, and fails to reach the active surface, it is possible to prevent that the wiring and so on formed in the active area are damaged by the laser beam.

APPLICATION EXAMPLE 7

This application example of the invention is directed to the sensor device of the above application example of the invention, wherein two or more of the stress relaxation layer and two or more of the relocation wirings are formed.

According to this application example of the invention, by providing a plurality of stress relaxation layers and a plurality of relocation wirings (a multilayer structure), the freedom of wiring pattern of the relocation wiring is enhanced, and it becomes possible to increase the area where the meltage protection layer can be formed. In other words, it becomes possible to enhance the freedom of the formation pattern of the meltage protection layer.

APPLICATION EXAMPLE 8

This application example of the invention is directed to a motion sensor including the sensor device according to any one of the application examples of the invention described above, and a package adapted to house the sensor device, wherein the sensor device is housed in the package.

According to the motion sensor of this application example of the invention, it is possible to provide the motion sensor equipped with the sensor device exerting the advantages described in the above application examples of the invention.

In addition thereto, since the motion sensor uses the low-profile sensor device, it becomes possible to realize the low-profile motion sensor.

APPLICATION EXAMPLE 9

This application example of the invention is directed to a motion sensor including a plurality of the sensor devices according to any one of the application examples of the invention described above, and a package adapted to house the sensor devices, wherein the sensor devices are disposed and housed in the package so that an angle formed by principal surfaces of the respective sensor elements becomes roughly right angle.

According to the motion sensor of this application example of the invention, it is possible to provide the motion sensor equipped with the sensor devices exerting the advantages described in the above application examples of the invention.

Further, in the motion sensor, since the sensor devices are disposed and housed in the package so that the angle formed by the principal surfaces of the respective sensor elements becomes roughly right angle, it becomes possible for the motion sensor to perform sensing corresponding to a plurality of axes by itself.

APPLICATION EXAMPLE 10

This application example of the invention is directed to the motion sensor of the above application example of the invention, wherein at least one principal surface of the sensor element is roughly parallel to a connection target surface to be connected to an external member of the package.

According to the motion sensor of this application example of the invention, it becomes possible for the motion sensor to perform sensing corresponding to a plurality of axes including the axis roughly perpendicular to the connection target surface of the package by itself.

APPLICATION EXAMPLE 11

This application example of the invention is directed to an electronic device including one of the sensor device according to either one of the application examples of the invention described above and the motion sensor according to either one of the application examples of the invention described above.

According to the electronic device of this application example of the invention, a small-sized and low-profile electronic device with stable electrical characteristics can be provided.

BRIEF DESCRIPTION OF THE DRAWINGS

The invention will be described with reference to the accompanying drawings, wherein like numbers reference like elements.

FIGS. 11A and 11B are diagrams for schematically showing a general configuration of a motion sensor according to a third embodiment of the invention, wherein FIG. 11A is a plan view, and FIG. 11B is an elevational cross-sectional view.

DESCRIPTION OF EXEMPLARY EMBODIMENTS

Figure 1:
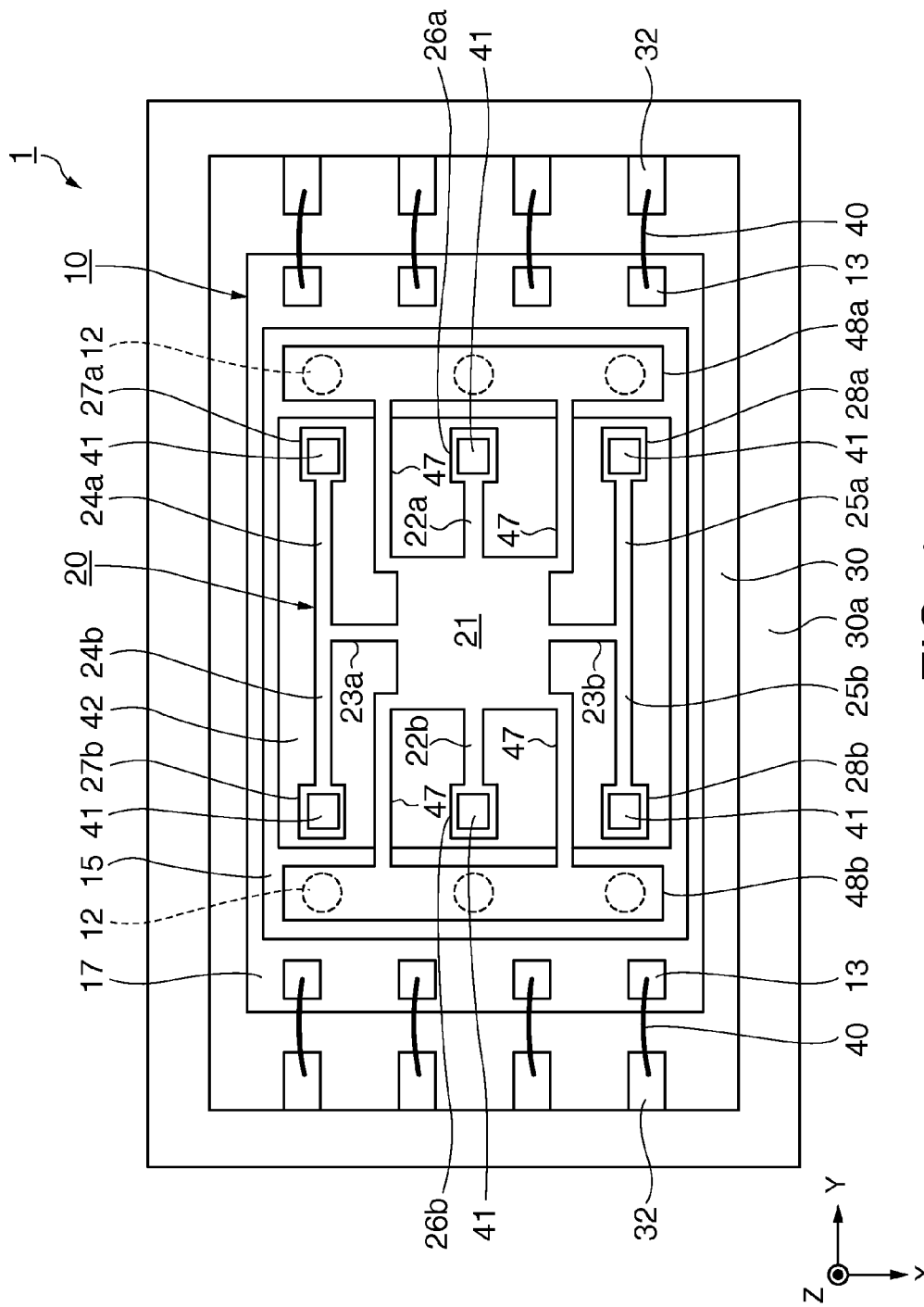
FIG. 1 is a schematic diagram showing a general configuration of a sensor device according to a first embodiment of the invention, and is a plan view obtained by looking down at the sensor device from the sensor element side.
Figure 2:
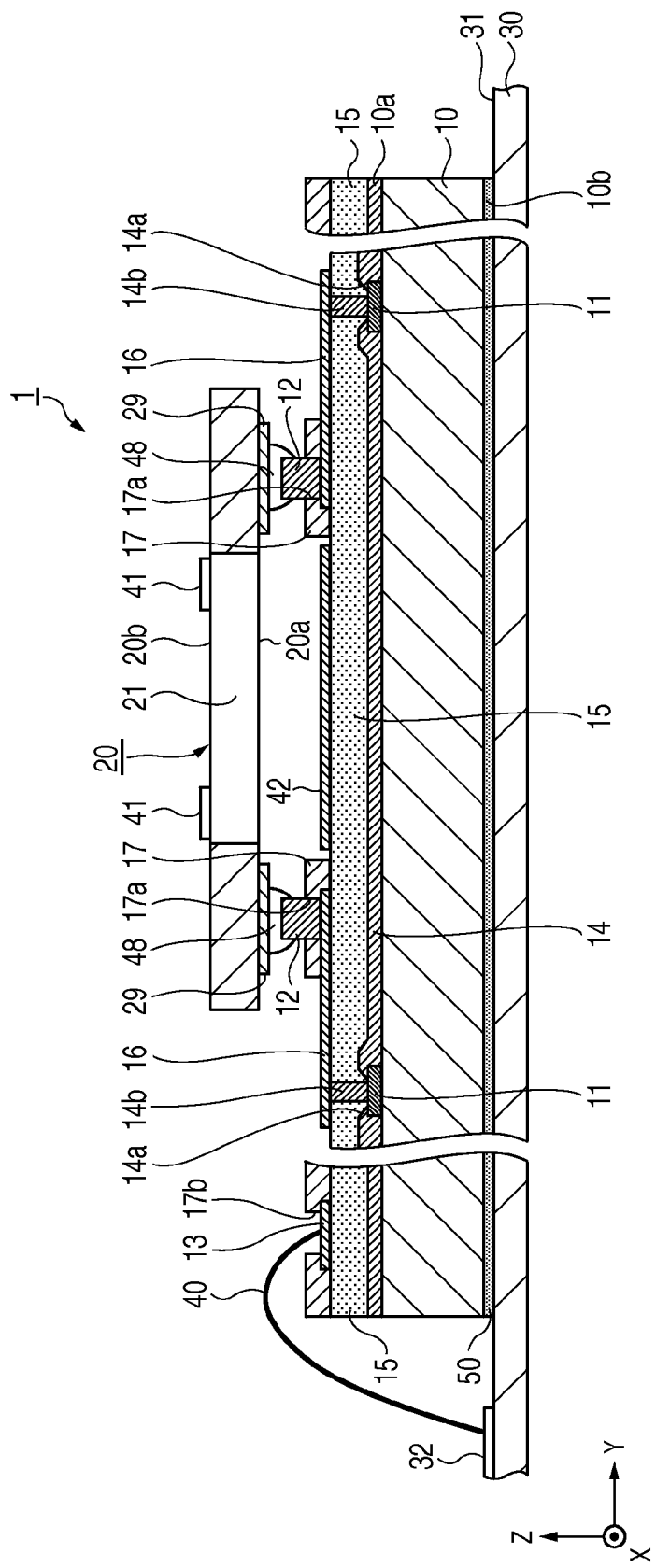
FIG. 2 is an elevational cross-sectional view showing the general configuration of the sensor device shown in FIG. 1.

Hereinafter, embodiments of the invention will be described with reference to the accompanying drawings.
First Embodiment FIG. 1 is a schematic diagram showing a general configuration of a sensor device according to a first embodiment of the invention, and is a plan view obtained by looking down at the sensor device from the sensor element side. FIG. 2 is an elevational cross-sectional view of the sensor device shown in FIG. 1.

As shown in FIGS. 1 and 2, the sensor device 1 is provided with a silicon substrate 10 as a semiconductor substrate, a vibration gyro element (a gyro vibrator element) 20 as a sensor element, a base substrate 30, and wires 40.

The silicon substrate 10 is provided with an integrated circuit (not shown) configured including semiconductor elements such as transistors and memory elements formed on an active surface 10a side. The integrated circuit is provided with a drive circuit for driving the vibration gyro element 20 to vibrate, and a detection circuit for detecting the detection vibration caused in the vibration gyro element 20 in response to the angular velocity applied thereto.

The silicon substrate 10 is provided with first electrodes 11 disposed on the active surface 10a side, external connecting terminals 12 disposed on the active surface 10a side so as to be electrically connected to the respective first electrodes 11, a stress relaxation layer 15 disposed between the active surface 10a and the external connecting terminals 12, and connecting terminals 13 disposed on the active surface 10a side.

The first electrodes 11 are each formed so as to have direct electrical contact with the integrated circuit of the silicon substrate 10. Further, a first insulating layer 14 to become a passivation film is formed on the active surface 10a, and the first insulating layer 14 is provided with opening sections 14a formed on the respective first electrodes 11.

According to such a configuration, the first electrodes 11 are in a condition of being exposed to the outside within the opening sections 14a.

The stress relaxation layer 15 made of insulating resin is formed on the first insulating layer 14 at the position avoiding the first electrodes 11 and other electrodes.

Further, on the stress relaxation layer 15, there are formed wiring lines 16 as relocation wiring. The wiring lines 16 are connected to the first electrodes 11 in the opening sections 14a of the first insulating layer 14 with via holes 14b disposed so as to penetrate the stress relaxation layer 15. The wiring lines 16 are for relocating the electrodes of the integrated circuit, and are formed so as to extend from the first electrodes 11 disposed on a predetermined section of the silicon substrate 10 toward the central portion via the via holes 14b.

The wiring lines 16 are used to wire the first electrodes 11 of the silicon substrate 10 and the external connecting terminals 12, and are therefore generally called the relocation wiring. The wiring lines 16 are important constituents for disposing the external connecting terminals at positions arbitrarily shifted with respect to the positions of the first electrodes 11 having strict positional restrictions due to micro design rules to thereby enhance the freedom of the connection positions in the silicon substrate 10 with respect to the vibration gyro element 20.

Further, on the stress relaxation layer 15, there is formed a meltage protection layer 42. The meltage protection layer 42 is formed on the stress relaxation layer 15 including the positions opposed to weight sections 27a, 27b, 28a, and 28b as a mass adjustment section of the vibration gyro element 20 when the vibration gyro element 20 is connected to the silicon substrate 10 as described later. The meltage protection layer 42 is formed as the relocation wiring similarly to the wiring lines 16, and is connected to the ground (GND) potential via a via hole and so on not shown.

It should be noted that the meltage protection layer 42 can also be disposed on the stress relaxation layer 15 at other positions, which include at least the positions opposed to the weight sections 27a, 27b, 28a, and 28b as the mass adjustment section and are opposed to the active surface 10a of the silicon substrate 10.

The meltage protection layer 42 is disposed at positions described above, and therefore exerts a laser beam blocking effect on the stress relaxation layer 15.

Further, the meltage protection layer 42 thus formed is connected to the ground (GND) potential, and is therefore capable of blocking the noise propagating to the power supply, the wiring lines formed in the active area of the semiconductor substrate, and so on. Therefore, it becomes possible to supply the power with a stable potential, and to prevent the influence of the noise on the electrical characteristics of the semiconductor substrate.

Further, a second insulating layer 17 made of resin and having a heat resistant property is formed on the wiring lines 16 and the stress relaxation layer 15 on the active surface 10a side of the silicon substrate 10. It should be noted that the second insulating layer 17 can be a solder resist.

The second insulating layer 17 is provided with opening section 17a formed on the wiring lines 16 above the stress relaxation layer 15. According to such a configuration, the wiring lines 16 are in a condition of being exposed to the outside within the opening sections 17a.

Further, the external connecting terminals 12 are disposed on the respective wiring lines 16 thus exposed inside the opening section 17a. The external connecting terminals 12 are each formed as a projection electrode formed of, for example, an Au stud bump. It should be noted that the external connecting terminals 12 can also be made of other conductive materials such as copper, aluminum, or solder balls besides the Au stud bump.

Under such a configuration, the integrated circuit provided to the silicon substrate 10 is arranged to be electrically connected to the vibration gyro element 20 via the first electrodes 11, the wiring lines 16, and the external connecting terminals 12.

On this occasion, since the sensor device 1 has the external connecting terminals 12 formed of the projection electrodes, a gap is formed between the vibration gyro element 20 and the silicon substrate 10.

Further, the integrated circuit provided to the silicon substrate 10 is provided with other electrodes not shown besides the first electrodes 11. Similarly to the case of the first electrodes 11, these electrodes have the relocation wiring connected thereto, and are connected to the connecting terminals 13 exposed to the outside within opening sections 17b of the second insulating layer 17.

The connecting terminals 13 are each a pad-like member for achieving electrical or mechanical connection, and are each connected to the base substrate 30 with the wire 40 made of metal such as gold (Au) or aluminum (Al).

It should be noted that although the explanation is presented with the configuration of using the wires 40 for the connection between the connecting terminals 13 and the base substrate 30, it is also possible to connect them using flexible printed circuits (FPC) instead of the wires 40.

The first electrodes 11, the other electrodes, and the connecting terminals 13 are made of titanium (Ti), titanium nitride (TiN), aluminum (Al), or copper (Cu), or an alloy including at least one of them. In particular, the connecting terminals 13 are preferably plated with nickel (Ni) or gold (Au) on the surfaces thereof in order for enhancing the bondability in the wire bonding process.

Thus, it is possible to prevent degradation in contactability and bondability in particular due to rust. Further, it is also possible to perform a topmost surface treatment such as solder plating or solder precoating.

Further, the relocation wiring such as the wiring lines 16 and the meltage protection layer 42 is made of gold (Au), copper (Cu), silver (Ag), titanium (Ti), tungsten (W), titanium tungsten (TiW), titanium nitride (TiN), nickel (Ni), nickel vanadium (NiV), chromium (Cr), aluminum (Al), palladium (Pd), and so on.

It should be noted that although described in detail in the description of a second embodiment in the latter portion, not only the single layer structure with the material described above but also a laminate structure combining a plurality of types of materials described above can be adopted as the relocation wiring such as the wiring lines 16. It should be noted that the relocation wiring such as the wiring lines 16 is generally formed in the same process, and is therefore made of the same material.

Further, as the resin for forming the first insulating layer 14 and the second insulating layer 17, there are used, for example, polyimide resin, silicone modified polyimide resin, epoxy resin, silicone modified epoxy resin, acrylic resin, phenol resin, benzocyclobutene (BCB), and polybenzoxazole (PBO).

It should be noted that the first insulating layer 14 can also be made of an inorganic insulating material such as silicon oxide ($SiO_2$) or silicon nitride ($Si_3N_4$).

It should be noted that the stress relaxation layer 15 can also be formed additionally in the peripheral portion of the silicon substrate 10 provided with the connecting terminals 13.

On the side (on an inactive surface 10b side) of the surface of the silicon substrate 10 opposed to the active surface 10a, there is bonded (connected) the base substrate 30 with an adhesive 50.

The base substrate 30 is made of an insulating material such as a ceramic substrate, and the connection surface 31 to be bonded to the silicon substrate 10 is provided with connection sections 32 each provided with a metal coating made of gold (Au), silver (Ag), and so on.

Further, the connection sections 32 and the connecting terminals 13 provided to the silicon substrate 10 are connected with the wires 40, respectively.

It should be noted that the base substrate 30 can be exemplified by a plate-like substrate, or a package (container) having a sidewall in the periphery thereof and a concave central portion.

If the base substrate 30 is the plate-like substrate, the silicon substrate 10, the vibration gyro element 20, and so on connected to each other on the base substrate 30 are airtightly sealed by a metal cap or the like, not shown, connected to the base substrate 30.

Further, if the base substrate 30 is the package (container) having a sidewall in the periphery thereof and a concave central portion, the silicon substrate 10, the vibration gyro element 20, and so on housed in the package are airtightly sealed using a metal lid or the like, not shown, bonded to the surface of the opening of the outside wall of the package.

The vibration gyro element 20 are formed using a quartz crystal, which is a piezoelectric material, as the base material (the material constituting the principal part). The quartz crystal has an X axis called an electrical axis, a Y axis called a mechanical axis, and a Z axis called an optical axis.

Further, the vibration gyro element 20 is carved out along a plane defined by the X axis and the Y axis perpendicular to each other in the crystal axes of the quartz crystal, then processed to have a plate-like shape, and therefore has a predetermined thickness in the Z axis direction perpendicular to the plane. It should be noted that the predetermined thickness is appropriately set in accordance with the oscillation frequency (resonant frequency), the outside dimension, the workability, and so on.

Further, the plate forming the vibration gyro element 20 can allow the error in the angle at which the plate is caved out from the quartz crystal in some range with respect to each of the X, Y, and Z axes. For example, it is possible to use the plate carved out after rotating in a range of 0 degree through 2 degrees around the X axis. The same can be applied to the Y and Z axes.

The vibration gyro element 20 is formed by etching (wet etching or dry etching) using a photolithography technology. It should be noted that a plurality of such vibration gyro elements 20 can be obtained from a single quartz wafer.

As shown in FIG. 1, the vibration gyro element 20 has a configuration called a double T type.

The vibration gyro element 20 is provided with a base section 21 located at the central portion, a pair of detecting vibrating arms 22a, 22b as a vibration section extending from the base section 21 along the Y axis, a pair of coupling arms 23a, 23b extending from the base section 21 along the X axis perpendicularly to the detecting vibrating arms 22a, 22b, and pairs of driving vibrating arms 24a, 24b, and 25a, 25b as vibrating sections extending from the tips of the respective coupling arms 23a, 23b along the Y axis in parallel to the detecting vibrating arms 22a, 22b.

Further, the vibration gyro element 20 is provided with a plurality of (four in the present embodiment) holding arms 47 extending from the base section 21 along the Y axis, and two element connection sections 48a, 48b disposed extending from the holding arms 47.

Further, the vibration gyro element 20 is provided with detection electrodes, not shown, in the detecting vibrating arms 22a, 22b, and drive electrodes, not shown, in the driving vibrating arms 24a, 24b, 25a, and 25b, respectively.

In the vibration gyro element 20, the detecting vibrating arms 22a, 22b constitute a detecting vibration system for detecting the angular velocity, and the coupling arms 23a, 23b and the driving vibrating arms 24a, 24b, and 25a, 25b constitute a driving vibration system for driving the vibration gyro element 20.

Further, the tip portions of the detecting vibrating arms 22a, 22b are provided with weight sections 26a, 26b, respectively, as mass adjustment sections, and the tip portions of the driving vibrating arms 24a, 24b, 25a, and 25b are provided with weight sections 27a, 27b, 28a, and 28b, respectively, as mass adjustment sections.

Further, a weight electrode 41 used for tuning is formed on the surface of each of the weight sections 26a, 26b, 27a, 27b, 28a, and 28b each having a widened shape.

By using such configurations as described above, the vibration gyro element 20 achieves downsizing and improvement of the angular velocity detection sensitivity.

The vibration gyro element 20 is disposed on the active surface 10a side of the silicon substrate 10 so as to overlap the silicon substrate 10 in a plan view.

It should be noted that the vibration gyro element 20 has the obverse/reverse surfaces of the base section 21 and the vibrating arms as the principal surfaces. Here, the surface electrically connected to the outside in the base section 21 is referred to as one principal surface 20a, and the surface opposed to the one principal surface 20a is referred to as the other principal surface 20b.

The one principal surface 20a of the element connection sections 48a, 48b of the vibration gyro element 20 is provided with lead electrodes 29 as connection electrodes respectively drawn from the detection electrodes and the drive electrodes, and each of the lead electrodes 29 and the corresponding external connecting terminal 12 of the silicon substrate 10 are electrically and mechanically connected to each other with an electrically conductive adhesive 48.

Thus, the vibration gyro element 20 is held by the silicon substrate 10.

Here, the operation of the vibration gyro element 20 of the sensor device 1 will be explained.

Figure 3:
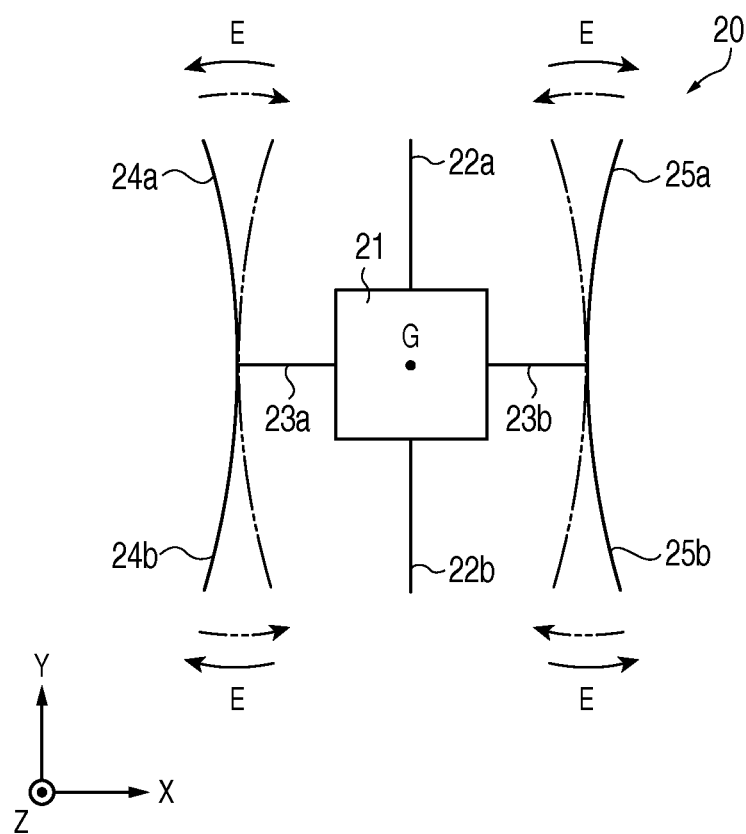
FIG. 3 is a schematic plan view for explaining the operation of a vibration gyro element.
Figure 4A:
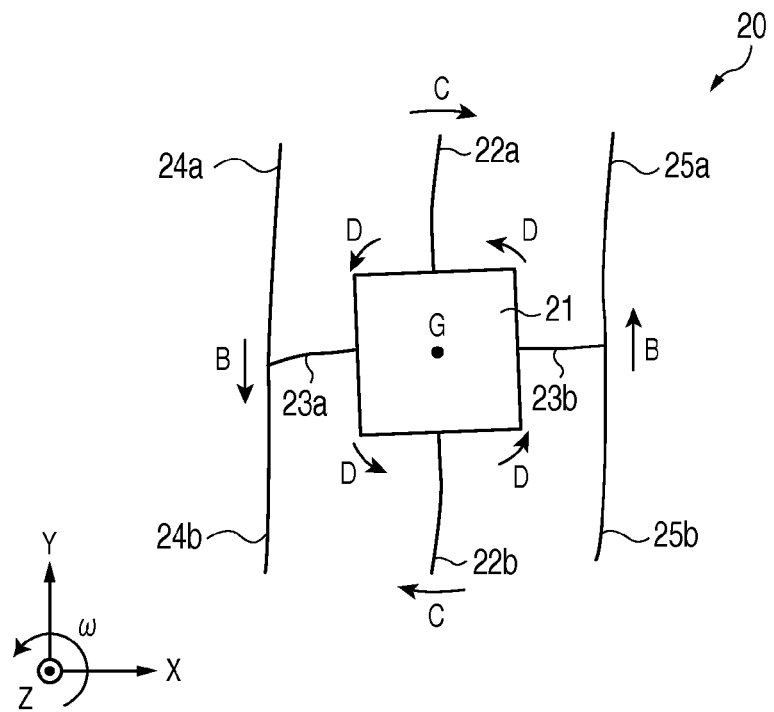
FIGS. 4A and 4B are schematic plan views for explaining the operation of a vibration gyro element.
Figure 4B:
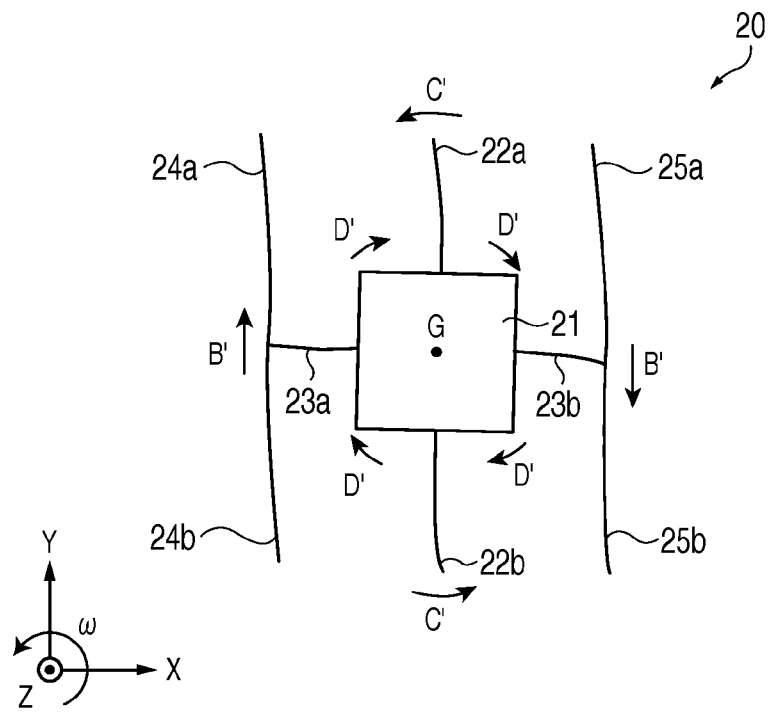

FIGS. 3, 4A, and 4B are schematic plan views for explaining the operation of the vibration gyro element. FIG. 3 shows the driving vibration state, and FIGS. 4A and 4B show the detecting vibration state in the condition supplied with the angular velocity.

It should be noted that in FIGS. 3, 4A, and 4B, each of the vibrating arms is illustrated with a line, and the holding arms 47 and the connection sections are omitted in order for simply expressing the vibration state.

In FIGS. 3, 4A, and 4B, the driving vibration state of the vibration gyro element 20 will be explained.

Firstly, in response to application of the drive signal from the integrated circuit (drive circuit) of the silicon substrate 10, the driving vibrating arms 24a, 24b, 25a, and 25b of the vibration gyro element 20 perform a flexural vibration in directions indicated by the arrows E in the condition added with no angular velocity. In this flexural vibration, the vibrational posture represented by the solid lines and the vibrational posture represented by the dashed-two dotted lines are repeated at a predetermined frequency.

Subsequently, if the angular velocity ω around the Z axis is applied to the vibration gyro element 20 in the condition of performing the driving vibration, the vibration gyro element 20 performs the vibration shown in FIGS. 4A and 4B.

Firstly, as shown in FIG. 4A, the Coriolis force in the direction of the arrow B acts on the driving vibrating arms 24a, 24b, 25a, and 25b and the coupling arms 23a, 23b constituting the driving vibration system. Further, at the same time, the detecting vibrating arms 22a, 22b are deformed in the direction of the arrow C in response to the Coriolis force in the direction of the arrow B.

Subsequently, as shown in FIG. 4B, the force returning in the direction of the arrow B' acts on the driving vibrating arms 24a, 24b, 25a, and 25b and the coupling arms 23a, 23b. Further, at the same time, the detecting vibrating arms 22a, 22b are deformed in the direction of the arrow C' in response to the force in the direction of the arrow B'.

The vibration gyro element 20 alternately repeats the series of operations described above to exert a new vibration.

It should be noted that the vibration in the directions of the arrows B, B' is a vibration in the circumferential direction with respect to the centroid G. Further, since the detection electrodes provided to the detecting vibrating arms 22a, 22b detect the distortion caused in the quartz crystal by the vibration, the vibration gyro element 20 obtains the angular velocity.

Here, a manufacturing method of the sensor device 1 according to the first embodiment will be explained.

Figure 5:
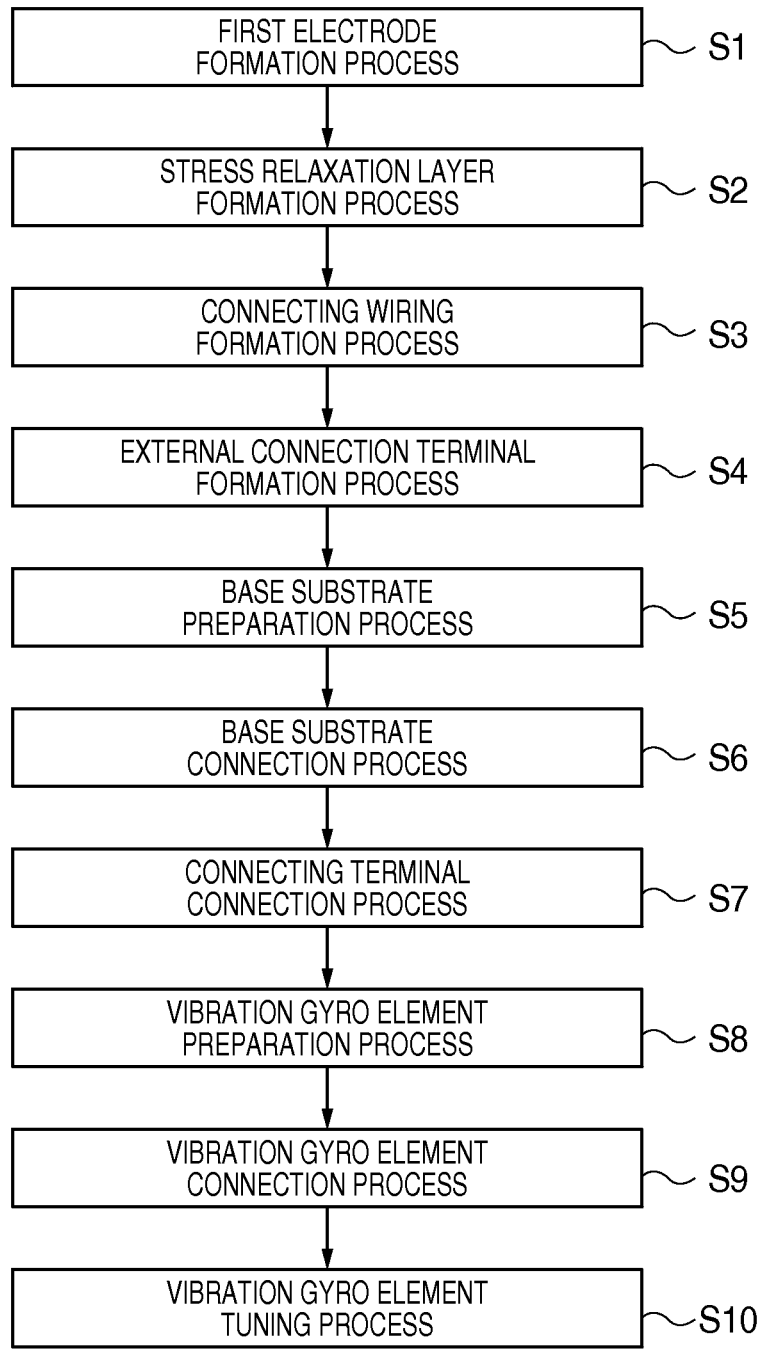
FIG. 5 is a flowchart showing a manufacturing process of the sensor device according to the first embodiment.

FIG. 5 is a flowchart showing the manufacturing process of the sensor device, and FIGS. 6A through 6C, 7, and 8 are schematic diagrams for explaining the respective steps of the manufacturing process.

Figure 6A:
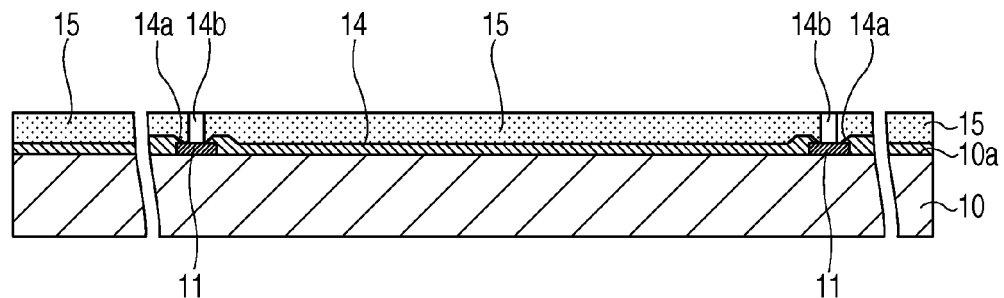
FIGS. 6A through 6C are schematic diagrams for explaining the manufacturing process of the sensor device according to the first embodiment, and are cross-sectional views for explaining the general configuration thereof along the sequence of the process.
Figure 6B:
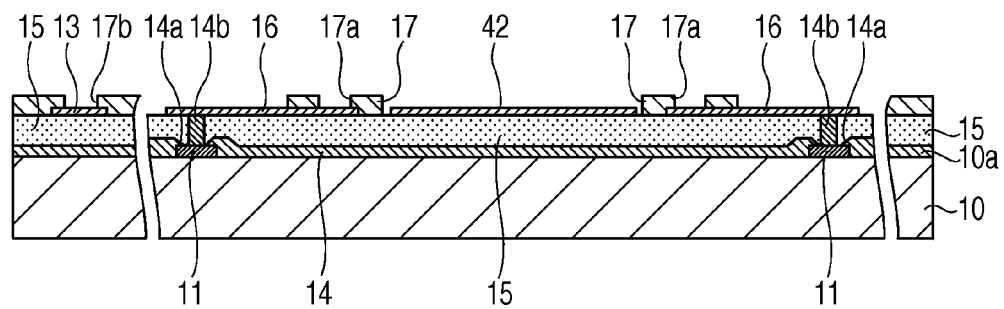
Figure 6C:
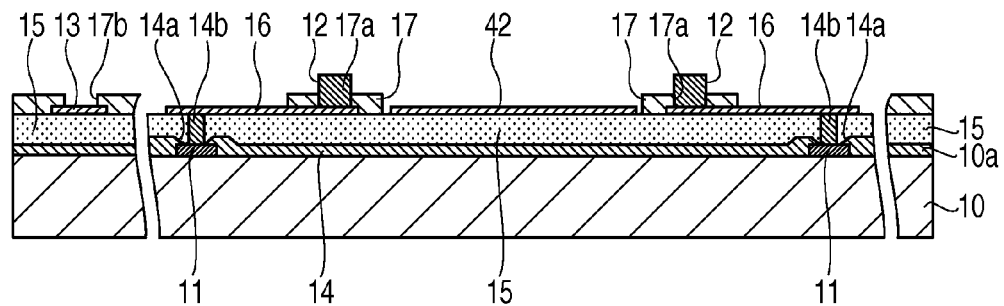

FIGS. 6A through 6C are cross-sectional views for explaining the manufacturing process of the silicon substrate part along the sequence of the process.

Figure 7:
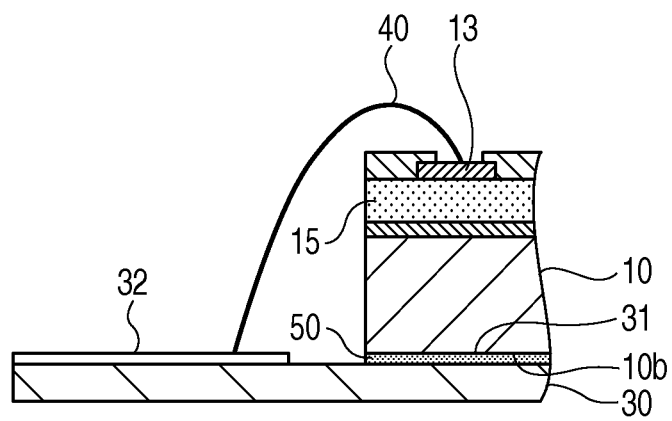
FIG. 7 is a schematic cross-sectional view for explaining the manufacturing process of the sensor device according to the first embodiment.

FIG. 7 is an elevational cross-sectional view showing a connection section between the silicon substrate side and the base substrate.

Figure 8:
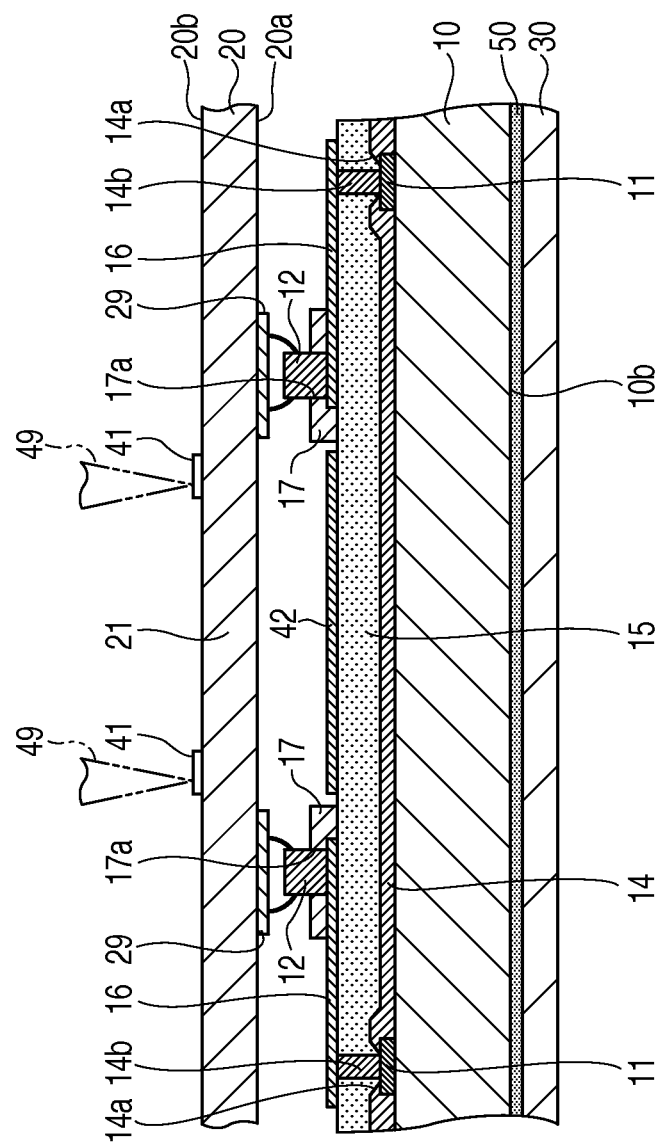
FIG. 8 is a schematic cross-sectional view for explaining the manufacturing process of the sensor device according to the first embodiment.

FIG. 8 is a schematic cross-sectional view for explaining the process of the state in which the vibration gyro element is connected.

As shown in FIG. 5, the manufacturing method of the sensor device 1 includes a first electrode formation process S1, a stress relaxation layer formation process S2, a connecting wiring formation process S3, an external connecting terminal formation process S4, a base substrate preparation process S5, a base substrate connection process S6, a connecting terminal connection process S7, a vibration gyro element preparation process S8, a vibration gyro element connection process S9, and a vibration gyro element tuning process S10.

First Electrode Formation Process S1

Firstly, the silicon substrate 10 is prepared.

Subsequently, as shown in FIG. 6A, the first electrodes 11 and other electrodes not shown are formed at positions to be the conductive sections of the integrated circuit on the active surface 10a of the silicon substrate 10.

Stress Relaxation Layer Formation Process S2

Subsequently, the first insulating layer 14 is formed on the silicon substrate 10 so as to cover the first electrodes 11 and the other electrodes, and then, a resin layer (not shown) to be a base of the stress relaxation layer 15 is formed so as to cover the first insulating layer 14.

Subsequently, the resin layer is patterned using a well-known photolithography method and etching method to thereby form the stress relaxation layer 15 having a predetermined shape, namely the central portion of the silicon substrate 10 except the positions immediately above the first electrodes 11 (the via holes 14*b*) and the positions immediately above the other electrodes.

It should be noted that the stress relaxation layer 15 can also be formed additionally in the peripheral portion of the silicon substrate 10 provided with the connecting terminals 13.

Further, the first insulating layer 14 covering the first electrodes 11 and the other electrodes is partially removed using a well-known photolithography method and etching method to thereby form the opening sections 14*a*. Thus, the first electrodes 11 and the other electrodes are exposed in these opening sections 14*a*.

Connecting Wiring Formation Process S3

Subsequently, as shown in FIG. 6B, the wiring lines 16 to be connected to the first electrodes 11 via the via holes 14*b* are formed, and at the same time, the relocation wiring (not shown) such as the meltage protection layer 42 to be connected to the other electrodes is formed. The formation of the relocation wiring such as the wiring lines 16 and the meltage protection layer 42 is performed by, for example, depositing the conductive materials such as titanium tungsten (TiW) and copper (Cu) in this order using a sputter method so as to have electrical contact with the first electrodes 11 within the opening sections 14*a* and the other electrodes disposed in the other opening sections not shown, then patterning it to have the wiring pattern, and then stacking copper (Cu) on the pattern thus obtained using a plating method.

Further, the tip portions of the relocation wiring, namely the connecting terminal 13 side thereof, are particularly patterned to have a pad-like shape to thereby use these portions as the connecting terminals 13.

Further, the connecting terminals 13 are particularly plated with nickel (Ni) or gold (Au) on the surfaces thereof to thereby enhance the bondability in the wire bonding process. It should be noted that it is also possible to perform a topmost surface treatment such as solder plating or solder precoating.

External Connecting terminal Formation Process S4

Subsequently, the second insulating layer 17 is formed so as to cover the wiring lines 16, the relocation wiring, and the connecting terminals 13, and further, the second insulating layer 17 covering the opposite side of the wiring lines 16 to the first electrode 11 side is partially removed using a well-known photolithography method and etching method to thereby form the opening sections 17*a*.

Thus, the wiring lines 16 are exposed within the respective opening sections 17*a*. Further, together therewith, the second insulating layer 17 covering the connecting terminals 13 is partially removed to form the opening sections 17*b* to thereby expose the connecting terminals 13 within the opening sections 17*b*.

Subsequently, as shown in FIG. 6C, the external connecting terminals 12 formed of the Au stud bumps are formed on the wiring lines 16 exposed within the opening sections 17*a*. It should be noted that the external connecting terminals 12 can also be made of other conductive materials such as copper, aluminum, solder balls, or printed solder paste besides the Au stud bumps.

It should be noted that since a plurality of silicon substrates 10 is usually obtained from a silicon wafer, and is therefore obtained by dicing (cutting) the wafer with a dicing device or the like into discrete chips.

Base Substrate Preparation Process S5

Subsequently, the base substrate 30 (see FIG. 7) formed of a ceramic substrate or the like is prepared. One of the surfaces of the base substrate 30 is provided with a connection sections 32 to which the electrical connection to the silicon substrate 10 is provided.

Base Substrate Connection Process S6

Subsequently, the inactive surface 10*b* side of the silicon substrate 10 is connected (bonded) to the connection surface 31, which is one of the surfaces of the base substrate 30 provided with the connection sections 32, with adhesive 50 (see FIG. 7).

Connecting Terminal Connection Process S7

Subsequently, as shown in FIG. 7, the connecting terminals 13 of the silicon substrate 10 and the connection sections 32 of the base substrate 30 are respectively connected to each other with the wires 40 using a wire bonding method.

Vibration Gyro Element Preparation Process S8

Subsequently, the vibration gyro element 20 having the configuration described above and obtained by cutting the quartz wafer into discrete chips is prepared.

Vibration Gyro Element Connection Process S9

Subsequently, as shown in FIG. 8, the vibration gyro element 20 is mounted on the silicon substrate 10, and then the external connecting terminals 12 of the silicon substrate 10 and the lead electrodes 29 formed of the one principal surface 20*a* of the element connection sections 48*a*, 48*b* of the vibration gyro element 20 are respectively connected to each other.

Vibration Gyro Element Tuning Process S10

Subsequently, as shown in FIG. 8, tuning of the vibration gyro element 20 is performed using laser beams 49.

The tuning is performed by irradiating the weight electrode 41 provided to each of the weight sections 26*a*, 26*b*, 27*a*, 27*b*, 28*a*, and 28*b* of the vibration gyro element 20 with a focused laser beam 49. The weight electrode 41 irradiated with the laser beam 49 is melted and then evaporated due to the energy of the laser beam 49. Due to the meltage and the evaporation of the weight electrode 41, the mass of each of the detecting vibrating arms 22*a*, 22*b*, and the driving vibrating arms 24*a*, 24*b*, 25*a*, and 25*b* varies. Thus, the resonant frequency of each of the detecting vibrating arms 22*a*, 22*b*, and driving vibrating arms 24*a*, 24*b*, 25*a*, and 25*b* varies, and thus the balance adjustment (the tuning) of each of the vibrating arms can be performed.

On this occasion, although the laser beam 49 having made the weight electrode 41 be melted and then evaporated is sometimes transmitted through the vibration gyro element 20, the laser beam 49 never reaches the stress relaxation layer 15 in the configuration of the present embodiment since the meltage protection layer 42 is disposed at the positions corresponding respectively to the weight sections 26*a*, 26*b*, 27*a*, 27*b*, 28*a*, and 28*b*. Thus, the meltage of the stress relaxation layer 15 due to the laser beam 49 transmitted through the vibration gyro element 20 can be prevent from occurring.

As described above, the sensor device 1 according to the first embodiment has the connecting terminals 13 disposed on the active surface 10*a* side of the silicon substrate 10, and the external connecting terminals 12 electrically connected to the first electrodes 11 via the stress relaxation layer 15 and the lead electrodes 29 of the base section 21 of the vibration gyro element 20 are respectively connected to each other.

According to this configuration, in the sensor device 1, the silicon substrate 10 can be connected to the base substrate 30 via the connecting terminals 13, and at the same time, the impact or the like applied from the outside can be absorbed and eased by the stress relaxation layer 15 disposed between the silicon substrate 10 and the external connecting terminals 12.

As a result, in the sensor device 1, since it becomes hard that the impact or the like applied from the outside is transmitted to the vibration gyro element 20, it becomes possible to directly connect the external connecting terminals 12 of the silicon substrate 10 and the vibration gyro element 20 without interposition of the lead wires used in the related art.

Therefore, in the sensor device 1, since the gap provided in consideration of the deflection amount of the lead wires becomes unnecessary, it becomes possible to reduce the thickness compared to the configuration of the related art.

Further, in the sensor device 1, since the electrical connection between the first electrodes 11 and the external connecting terminals 12 is provided by the relocation wiring (e.g., the wiring lines 16) disposed on the active surface 10a side of the silicon substrate 10, it is possible to freely (arbitrarily) design the positions and the arrangement of the external connecting terminals 12 with the relocation wiring.

Further, in the sensor device 1, since the external connecting terminals 12 are the projection electrodes, it becomes possible to provide the gap between the vibration gyro element 20 and the silicon substrate 10, and thus, it becomes possible to avoid the contact between the vibration gyro element 20 and the silicon substrate 10.

Thus, it becomes possible for the sensor device 1 to perform stable drive of the vibration gyro element 20.

Further, in the sensor device 1, the meltage protection layer 42 disposed on the surface of the stress relaxation layer 15 can prevent the meltage of the stress relaxation layer 15 due to the laser beam 49 transmitted through the vibration gyro element 20, which has easily occurred due to the reduction of the distance between the vibration gyro element 20 and the stress relaxation layer 15. Thus, the molten particles generated when the stress relaxation layer 15 is melted can be prevented from being attached to the principal surface 20a of the vibration gyro element 20. Thus, it becomes possible to prevent the deterioration in the electrical characteristics of the vibration gyro element 20 such as the variation in tuning due to, for example, attachment and detachment of the molten particles of the stress relaxation layer 15 thus attached.

Further, the laser beam 49 transmitted through the vibration gyro element 20 can also be prevented from being transmitted through the stress relaxation layer 15 to reach the active surface 10a of the silicon substrate 10, and damaging the integrated circuit and so on disposed on the active surface 10a. The configuration described above is particularly preferable for the sensor device to which further low-profiling is required.

Further, according to the manufacturing method of the sensor device 1, it is possible to manufacture and then provide the sensor device 1 exerting the advantages described above.

It should be noted that the lead electrode 29 as the connection electrode can be provided to other portions than the element connection sections 48a, 48b, such as the principal surface 20a of the base section 21.

It should be noted that this configuration can also be applied to the following embodiments.

Second Embodiment

Figure 9:
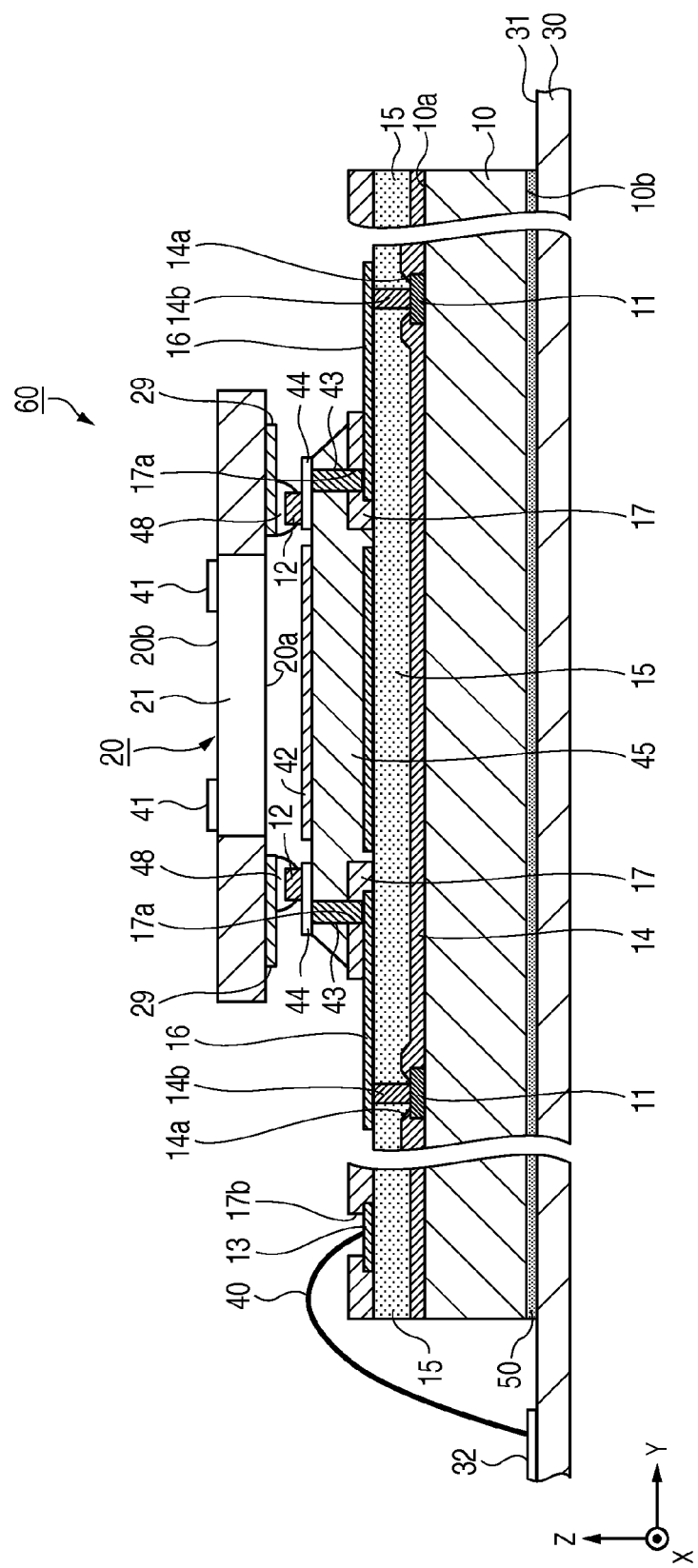
FIG. 9 is an elevational cross-sectional view schematically showing a general configuration of a sensor device according to a second embodiment of the invention.
Figure 10:
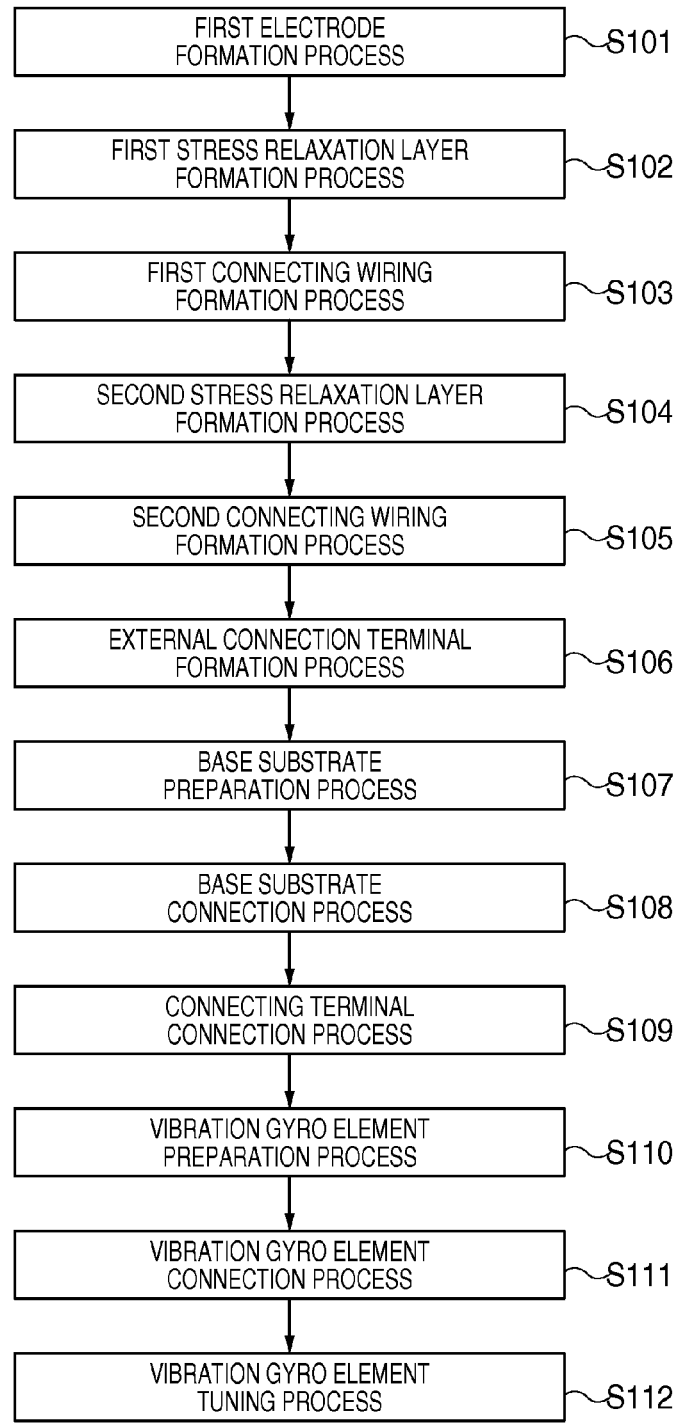
FIG. 10 is a flowchart showing a manufacturing process of the sensor device according to the second embodiment.

A sensor device according to a second embodiment of the invention will be explained with reference to FIGS. 9 and 10. FIG. 9 is an elevational cross-sectional view schematically showing a general configuration of the sensor device according to the second embodiment, and FIG. 10 is a flowchart showing a manufacturing process of the sensor device according to the second embodiment.

It should be noted that the sensor device according to the second embodiment has a configuration different in the stress relaxation layer and the relocation wiring from that of the first embodiment. The sections common to the first and second embodiments are denoted with the same reference numerals, and the explanation therefor will be omitted, while the sections different from those of the first embodiment described above will mainly be explained.

As shown in FIG. 9, the sensor device 60 according to the second embodiment has a configuration obtained by stacking the relocation wiring including the stress relaxation layer 15 as a first stress relaxation layer and the wiring lines 16 as a first connecting wiring, and the relocation wiring including a stress relaxation layer 45 as a second stress relaxation layer and wiring lines 44 as a second connecting wiring.

The configurations of the silicon substrate 10 and the vibration gyro element 20 are substantially the same as those of the first embodiment, and therefore the explanation therefor will be omitted.

The stress relaxation layer 15 made of insulating resin is formed on the first insulating layer 14 at the position avoiding the first electrodes 11 and other electrodes.

Further, on the stress relaxation layer 15, there are formed wiring lines 16 as relocation wiring. The wiring lines 16 are connected to the first electrodes 11 in the opening sections 14a of the first insulating layer 14 with via holes 14b disposed so as to penetrate the stress relaxation layer 15. The wiring lines 16 are for relocating the electrodes of the integrated circuit, and are formed so as to extend from the first electrodes 11 disposed on a predetermined section of the silicon substrate 10 toward the central portion via the via holes 14b.

Further, on the stress relaxation layer 15, the wiring lines 16, and so on, there are formed additional layers, namely the stress relaxation layer 45, the layer of the wiring lines 44, and a meltage protection layer 42. The wiring lines 44 is connected to the wiring lines 16 using via holes 43 provided to the stress relaxation layer 45. It should be noted that the wiring lines 44 can also be connected to other wiring lines or terminals not shown.

The meltage protection layer 42 is formed at least at the positions opposed to the weight sections 27a, 27b, 28a, and 28b as the mass adjustment sections of the vibration gyro element 20 when the vibration gyro element 20 is connected to the silicon substrate 10 as described later. The meltage protection layer 42 is formed as the relocation wiring similarly to the wiring lines 44, and is connected to the ground (GND) potential via a via hole, wiring lines, and so on not shown.

Further, the meltage protection layer 42 can also be disposed so as to be opposed to the active surface 10a of the silicon substrate 10 including the positions opposed to the weight sections 27a, 27b, 28a, and 28b as the mass adjustment sections.

The meltage protection layer 42 thus formed is connected to the ground (GND) potential, and is therefore capable of blocking the noise propagating to the power supply, the wiring lines formed in the active area of the semiconductor substrate, and so on. Therefore, it becomes possible to supply the power with a stable potential, and to prevent the influence of the noise on the electrical characteristics of the semiconductor substrate.

Further, the external connecting terminals 12 are formed on the wiring lines 44. The external connecting terminals 12 are formed as projection electrodes formed to have the bump-like shape similarly to the first embodiment.

Under such a configuration, the integrated circuit provided to the silicon substrate 10 is electrically connected to the vibration gyro element 20 via the first electrodes 11, the wiring lines 16, 44, the external connecting terminals 12, and so on.

Here, a manufacturing method of the sensor device 60 according to the second embodiment will be explained.

FIG. 10 is a flowchart showing a manufacturing process of the sensor device.

As shown in FIG. 10, the manufacturing method of the sensor device 60 includes a first electrode formation process S101, a first stress relaxation layer formation process S102, a first connecting wiring formation process S103, a second stress relaxation layer formation process S104, a second connecting wiring formation process S105, an external connecting terminal formation process S106, a base substrate preparation process S107, a base substrate connection process S108, a connecting terminal connection process S109, a vibration gyro element preparation process S110, a vibration gyro element connection process S111, and a vibration gyro element tuning process S112.

In the following explanation, the first stress relaxation layer formation process S102, the first connecting wiring formation process S103, the second stress relaxation layer formation process S104, and the second connecting wiring formation process S105 in which the present manufacturing process is different from the manufacturing process explained in the first embodiment will be described, and other processes substantially the same as those in the first embodiment will be omitted.

First Stress Relaxation Layer Formation Process S102

Subsequently to the first electrode formation process S101, the first insulating layer 14 is formed on the silicon substrate 10 so as to cover the first electrodes 11 and the other electrodes, and further, a resin layer (not shown) to be a base of the stress relaxation layer 15 as the first stress relaxation layer is formed so as to cover the first insulating layer 14.

Subsequently, the resin layer is patterned using a well-known photolithography method and etching method to thereby form the stress relaxation layer 15 having a predetermined shape, namely the central portion of the silicon substrate 10 except the positions immediately above the first electrodes 11 (the via holes 14b) and the positions immediately above the other electrodes.

It should be noted that the stress relaxation layer 15 can also be formed additionally in the peripheral portion of the silicon substrate 10 provided with the connecting terminals 13.

Further, the first insulating layer 14 covering the first electrodes 11 and the other electrodes is partially removed using a well-known photolithography method and etching method to thereby form the opening sections 14a. Thus, the first electrodes 11 and the other electrodes are exposed in these opening sections 14a.

First Connecting Wiring Formation Process S103

Subsequently, the wiring lines 16 to be connected to the first electrodes 11 via the via holes 14b are formed, and at the same time, the relocation wiring (not shown) to be connected to the other electrodes is formed. The formation of the wiring lines 16 and the relocation wiring is performed by, for example, depositing the conductive materials such as titanium tungsten (TiW) and copper (Cu) in this order using a sputter method so as to have electrical contact with the first electrodes 11 within the opening sections 14a and the other electrodes disposed in the other opening sections not shown, then patterning it to have the wiring pattern, and then stacking copper (Cu) on the pattern thus obtained using a plating method.

Further, the tip portions of the relocation wiring, namely the connecting terminal 13 side thereof, are particularly patterned to have a pad-like shape to thereby use these portions as the connecting terminals 13.

Further, the connecting terminals 13 are particularly plated with nickel (Ni) or gold (Au) on the surfaces thereof to thereby enhance the bondability in the wire bonding process.

It should be noted that it is also possible to perform a topmost surface treatment such as solder plating or solder precoating.

Second Stress Relaxation Layer Formation Process S104

Subsequently, a resin layer (not shown) to be a base of the stress relaxation layer 45 as the second stress relaxation layer is formed on the stress relaxation layer 15.

Subsequently, the resin layer is patterned using a well-known photolithography method and etching method to thereby form the stress relaxation layer 45 having a predetermined shape, namely the central portion of the silicon substrate 10 except the positions immediately above the via holes 43 for connecting the wiring lines 16 and the wiring lines 44 to each other and the other electrodes.

It should be noted that the stress relaxation layer 45 can also be formed additionally in the peripheral portion of the silicon substrate 10 provided with the connecting terminals 13.

Second Connecting Wiring Formation Process S105

Subsequently, the wiring lines 44 as the second connecting wiring are formed on the stress relaxation layer 45, and at the same time, the relocation wiring (not shown) such as the meltage protection layer 42 connected to the other electrodes is formed. The formation of the relocation wiring such as the wiring lines 44 and the meltage protection layer 42 is performed by, for example, depositing the conductive materials such as titanium tungsten (TiW) and copper (Cu) in this order using a sputter method so as to have electrical contact with the via holes 43 and the other electrodes disposed in the other opening sections not shown, then patterning it to have the wiring pattern, and then stacking copper (Cu) on the pattern thus obtained using a plating method.

Subsequently, the external connecting terminal formation process S106 is performed. The process on and after the external connecting terminal formation process S106 is substantially the same as in the first embodiment, and therefore, the explanation therefor will be omitted.

According to the sensor device 60 of the second embodiment having the configuration described above, in addition to the advantage of the first embodiment, the freedom of the wiring pattern of the relocation wiring is enhanced by adopting the multilayer structure of the stress relaxation layers, the wiring lines, the relocation wiring, and so on, and thus, it becomes possible to enlarge the formation area of the meltage protection layer 42. In other words, it becomes possible to enhance the freedom of the formation pattern of the meltage protection layer 42, and thus, it becomes possible to make a contribution to further downsizing of the sensor device 60.

Although in the second embodiment described above the explanation is made using the example of forming the meltage protection layer 42 on the stress relaxation layer 45 as the second stress relaxation layer, the meltage protection layer 42 can also be disposed on the upper surface of the stress relaxation layer 15 as the first stress relaxation layer, in other words, between stress relaxation layer 15 as the first stress relaxation layer and the stress relaxation layer 45 as the second stress relaxation layer. By also using such a configuration, it is possible to prevent the laser beam 49 transmitted through the vibration gyro element 20 from being transmitted through the stress relaxation layers 15, 45 to reach the active surface 10a of the silicon substrate 10, and damaging the integrated circuit and so on disposed on the active surface 10a.

Third Embodiment

Figure 11A:
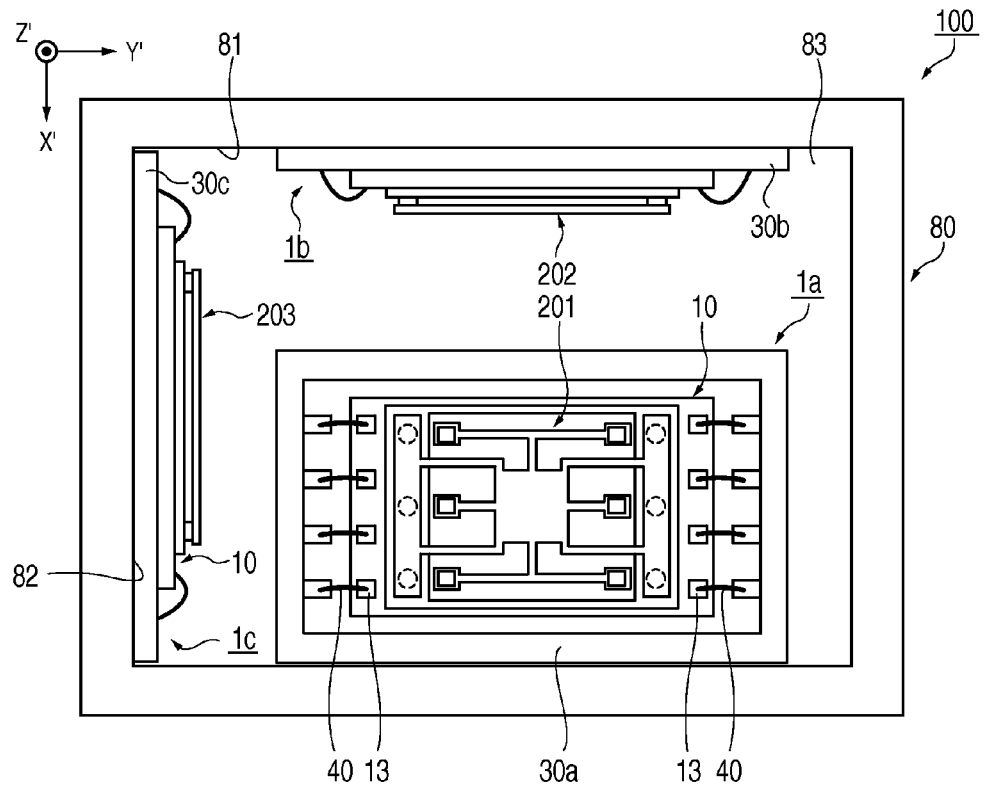
Figure 11B:
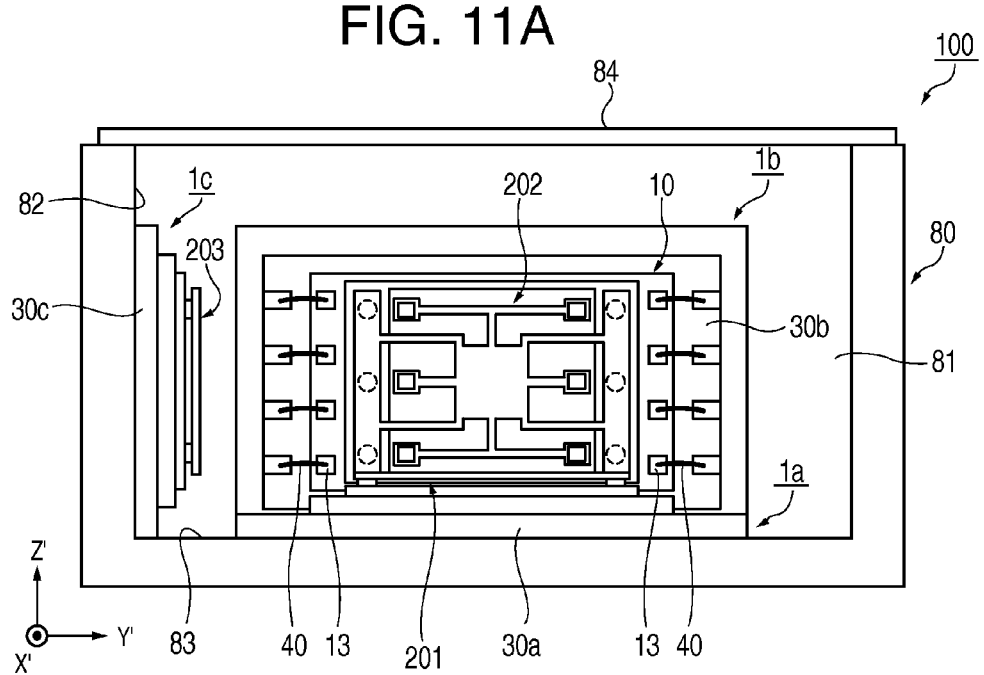

FIGS. 11A and 11B are schematic diagrams showing a general configuration of a gyro sensor as a motion sensor according to a third embodiment of the invention. FIG. 11A is a plan view of the gyro sensor viewed downward from the top surface of a package, and FIG. 11B is an elevational cross-sectional view corresponding to FIG. 11A.

It should be noted that a lid is omitted in FIG. 11A for the sake of convenience. Further, the explanation of the sections common to the first and second embodiments will be omitted.

As shown in FIG. 11, the gyro sensor 100 as the motion sensor has three sensor devices (hereinafter referred to as a sensor device 1a, a sensor device 1b, and a sensor device 1c, and are each the same as either one of the sensor devices 1, 60 explained as the first and second embodiments), and a package 80 having a substantially rectangular shape and housing the sensor devices inside, and the sensor devices 1a, 1b, and 1c are disposed and housed inside the package 80.

The package 80 is provided with a recess section having inner surfaces including a bottom surface 83, and wall surfaces 81, 82. The recess section is covered by the lid (lid member) 84 after the sensor devices 1a, 1b, and 1c are housed inside.

An aluminum oxide-based sintered body obtained by shaping, stacking, and then calcining the ceramic green sheet, for example, is used as the package 80. Further, as the lid 84, metal such as kovar, glass, ceramic, and so on is used.

The sensor device 1a is fixed and connected to the bottom surface 83 of the package 80 so that one principal surface 20a (see FIG. 2, hereinafter the description of the reference will be omitted) or the other principal surface 20b (see FIG. 2, hereinafter the description of the reference will be omitted) and the bottom surface 83 of the recess section of the package 80 become roughly parallel to each other. Further, the sensor device 1a is electrically connected to package internal electrodes not shown.

The other two sensor devices 1b, 1c are disposed and housed inside the package 80 so that the angles formed by the one principal surfaces 20a or the other principal surfaces 20b of the respective vibration gyro elements 201, 202, and 203 become roughly right angle.

The sensor device 1b is fixed and connected to the wall surface 81 of the package 80, and the sensor device 1c is fixed and connected to the wall surface 82 of the package 80. Both of the sensor devices 1b, 1c are electrically connected to package internal electrodes not shown.

It should be noted that the package internal electrodes are electrically connected to external electrodes (not shown) disposed outside the package 80. The external electrodes and the package internal electrodes are each formed of a metal coating obtained by stacking coating films made of, for example, nickel (Ni) and gold (Au) on a metalization layer made of, for example, tungsten (W) using, for example, a plating method.

The lid 84 of the gyro sensor 100 is bonded to the top surface of the package 80 with a bonding material such as a seam ring or low-melting glass in a condition in which the sensor devices 1a, 1b, and 1c are disposed and housed as described above inside the package 80.

Thus, the inside of the package 80 is sealed airtightly. It should be noted that the inside of the package 80 is preferably held in a vacuum state (a state with a high degree of vacuum) so as not to hinder the vibrations of the vibration gyro elements 201, 202, and 203 of the respective sensor devices.

Here, an outline of the operation of the gyro sensor 100 will be explained.

It is assumed here that the bottom surface 83 of the package 80 is parallel to an X' axis and a Y' axis and perpendicular to a Z' axis with respect to the X', Y', and Z' axes as the three axes perpendicular to each other.

Therefore, since the sensor device 1a is housed inside the package 80 so that the one principal surface 20a or the other principal surface 20b of the vibration gyro element 201 and the bottom surface 83 of the package 80 become roughly parallel to each other, and therefore, the one principal surface 20a or the other principal surface 20b of the vibration gyro element 201 and the Z' axis are roughly perpendicular to each other, the sensor device 1a detects the angular velocity around the Z' axis when the posture of the gyro sensor 100 is changed by an external force and the angular velocity is applied thereto.

On the other hand, since the two sensor devices 1b, 1c are housed inside the package 80 so that the angle formed by the one principal surfaces 20a or the other principal surfaces 20b of the vibration gyro elements 202, 203 becomes roughly right angle, and the angles formed by the one principal surfaces 20a or the other principal surfaces 20b of the vibration gyro elements 202, 203 and the one principal surface 20a or the other principal surface 20b of the vibration gyro element 201 of the sensor device 1a become roughly right angle, and therefore, the one principal surface 20a or the other principal surface 20b of the vibration gyro element 202 and the X' axis are roughly perpendicular to each other, and the one principal surface 20a or the other principal surface 20b of the vibration gyro element 203 and the Y' axis are roughly perpendicular to each other, one of the sensor devices 1b, 1c detects the angular velocity around the X' axis, and the other of the sensor devices 1b, 1c detects the angular velocity around the Y' axis.

According to these operations, the gyro sensor 100 can detect the angular velocity around each of the X', Y', and Z' axes as the three axes perpendicular to each other by itself.

Therefore, the gyro sensor 100 is preferably used for camera shake correction of an imaging device, posture detection and posture control of a vehicle in the mobile navigation system using global positioning system (GPS) satellite signals, and so on.

Further, the gyro sensor 100 uses the sensor device according to one of the first and second embodiments, and therefore has the advantages equivalent to those of the sensor device according to one of the first and second embodiments. Therefore, the gyro sensor 100 is capable of achieving downsizing and low-profiling while keeping the stable electrical characteristics.

It should be noted that although the gyro sensor 100 as the motion sensor according to the third embodiment is explained with the example using the three sensor devices 1a, 1b, and 1c, the number of sensor devices is not limited thereto, but can be any number equal to or larger than one. For example, if one sensor device is used, it is possible to detect the angular velocity in one axial direction, and if two sensor devices are used, it becomes possible to detect the angular velocity in two axial directions.

Electronic Device

Figure 12A:
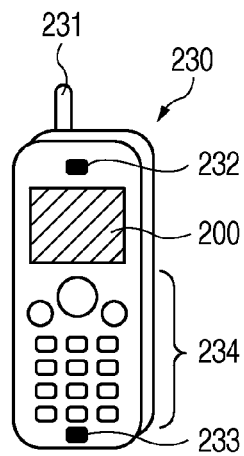
FIGS. 12A through 12C are perspective views schematically showing electronic devices each equipped with the sensor device or the motion sensor.
Figure 12B:
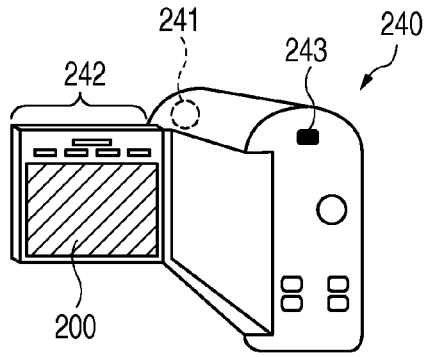
Figure 12C:
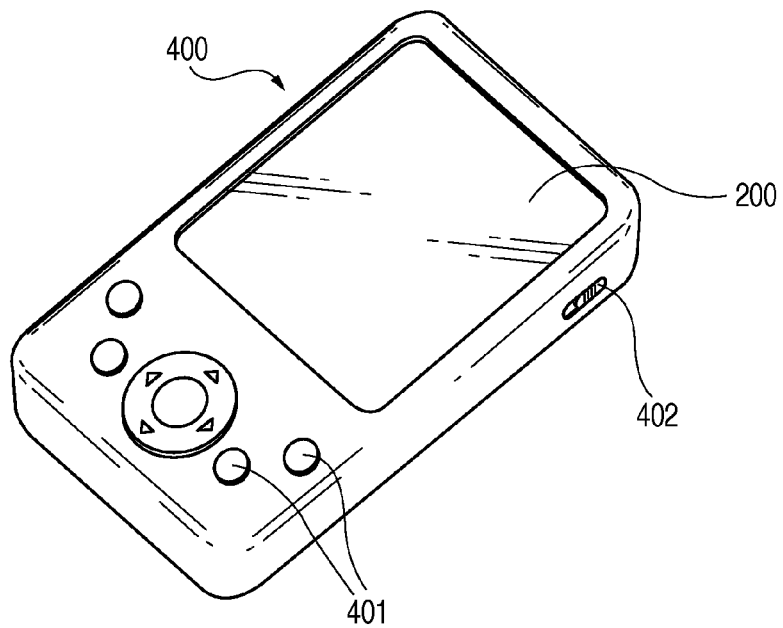

Electronic devices each equipped with the sensor device or the motion sensor described above will hereinafter be explained with reference to FIGS. 12A through 12C. FIGS. 12A through 12C are conceptual diagrams for explaining the electronic devices each equipped with the sensor device or the motion sensor.

FIG. 12A shows an application example thereof to a cellular phone. The cellular phone 230 is provided with an antenna section 231, an audio output section 232, an audio input section 233, an operation section 234, and a display section 200, and the sensor device or the motion sensor described above is installed in a control circuit section not shown.

FIG. 12B shows an application example thereof to a video camera. The video camera 240 is provided with an image receiving section 241, an operation section 242, an audio input section 243, and the display section 200, and the sensor device or the motion sensor described above is installed in a control circuit section not shown.

FIG. 12C shows an application example thereof to a personal digital assistant (PDA). The personal digital assistant 400 is provided with a plurality of operation buttons 401 and a power switch 402, and the display section 200, and the sensor device or the motion sensor described above is installed in a control circuit section not shown.

The sensor device and the motion sensor thus installed are small in size and have stable electrical characteristics, and can therefore make a contribution to downsizing of the electronic device and the stabilization of the characteristics.

It should be noted that as the electronic device to which the sensor device or the motion sensor is installed, there can be cited a game machine, a game terminal, a digital still camera, a vehicle navigation system, a workstation, a videophone, and so on, besides the devices shown in FIGS. 12A through 12C. Further, the sensor device and the motion sensor are preferable as the members which fulfill the motion sensing function of such various types of electronic devices as described above.

The entire disclosure of Japanese Patent Application No. 2010-220798, filed Sep. 30, 2010 is expressly incorporated by reference herein.

What is claimed is:

1. A sensor device comprising:
a semiconductor substrate;
a first electrode disposed on an active surface side of the semiconductor substrate;
an external connecting terminal disposed on the active surface side and electrically connected to the first electrode;
at least one stress relaxation layer disposed between the semiconductor substrate and the external connecting terminal;
a connecting terminal disposed on the active surface side of the semiconductor substrate; and
a sensor element including a base section, a vibrating section and a connection section extending from the base section, and a mass adjustment section provided to the vibrating section,
wherein the sensor element is held by the semiconductor substrate due to connection between the connection section and the external connecting terminal, and
a meltage protection layer formed in an area where the stress relaxation layer and the mass adjustment section overlap each other in a plan view is provided.

2. The sensor device according to claim 1, wherein electrical connection between the first electrode and the external connecting terminal is achieved by at least one relocation wiring disposed on the active surface side.

3. The sensor device according to claim 1, wherein the external connecting terminal is a projection electrode.

4. The sensor device according to claim 1, wherein the meltage protection layer is formed on an external surface on a sensor element side of the stress relaxation layer.

5. The sensor device according to claim 1, wherein the meltage protection layer is a metal layer connected to a ground (GND) potential.

6. The sensor device according to claim 1, wherein the active surface side of the semiconductor substrate is covered by the meltage protection layer.

7. The sensor device according to claim 2, wherein two or more of the stress relaxation layers and two or more of the relocation wirings are formed.

8. A motion sensor comprising:
the sensor device according to claim 1; and
a package adapted to house the sensor device,
wherein the sensor device is housed in the package.

9. A motion sensor comprising:
the sensor device according to claim 2; and
a package adapted to house the sensor device,
wherein the sensor device is housed in the package.

10. A motion sensor comprising:
a plurality of the sensor devices according to claim 1; and
a package adapted to house the sensor devices,
wherein the sensor devices are disposed and housed in the package so that an angle formed by principal surfaces of the respective sensor elements becomes roughly right angle.

11. A motion sensor comprising:
a plurality of the sensor devices according to claim 2; and
a package adapted to house the sensor devices,
wherein the sensor devices are disposed and housed in the package so that an angle formed by principal surfaces of the respective sensor elements becomes roughly right angle.

12. The motion sensor according to claim 10, wherein at least one principal surface of the sensor element is roughly parallel to a connection target surface to be connected to an external member of the package.

13. The motion sensor according to claim 11, wherein at least one principal surface of the sensor element is roughly parallel to a connection target surface to be connected to an external member of the package.

14. An electronic device comprising:
the motion sensor according to claim 8.

15. An electronic device comprising:
the motion sensor according to claim 10.

16. The electronic device according to claim 15, wherein at least one principal surface of the sensor element is roughly parallel to a connection target surface to be connected to an external member of the package.

17. The electronic device according to claim 14, wherein electrical connection between the first electrode and the external connecting terminal is achieved by at least one relocation wiring disposed on the active surface side.

18. The electronic device according to claim 15, wherein electrical connection between the first electrode and the external connecting terminal is achieved by at least one relocation wiring disposed on the active surface side.

19. The electronic device according to claim 16, wherein electrical connection between the first electrode and the external connecting terminal is achieved by at least one relocation wiring disposed on the active surface side.

* * * * *